United States Patent
Patel et al.

(10) Patent No.: US 6,451,505 B1
(45) Date of Patent: Sep. 17, 2002

(54) IMAGEABLE ELEMENT AND METHOD OF PREPARATION THEREOF

(75) Inventors: Jayanti Patel, Woodcliff Lake, NJ (US); Ken-Ichi Shimazu, Briarcliff Manor, NY (US); Jianbing Huang, Wood Ridge; Nishith Merchant, North Bergen, both of NJ (US); S. Peter Pappas, Juno Beach, FL (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/633,029

(22) Filed: Aug. 4, 2000

(51) Int. Cl.$^7$ ................................................. G03G 7/004
(52) U.S. Cl. .................... 430/273.1; 430/200; 430/302; 430/320; 430/327; 430/328; 430/944
(58) Field of Search ............................... 430/273.1, 320, 430/302, 200, 944, 327, 328

(56) References Cited

U.S. PATENT DOCUMENTS

| | | | |
|---|---|---|---|
| 3,635,709 A | 1/1972 | Kobayashi | 96/33 |
| 3,847,614 A | 11/1974 | Mattor | 96/175 |
| 3,859,099 A | 1/1975 | Petropoulos et al. | 96/90 |
| 4,154,614 A | 5/1979 | Tsunoda et al. | 96/75 |
| 4,306,010 A | 12/1981 | Uehara et al. | 430/190 |
| 4,306,011 A | 12/1981 | Uehara et al. | 430/190 |
| 4,308,368 A | 12/1981 | Kubo et al. | 525/504 |
| 4,408,532 A | 10/1983 | Incremona | 101/456 |
| 4,506,003 A | 3/1985 | Ruckert et al. | 430/270 |
| 4,631,245 A | 12/1986 | Pawlowski | 430/175 |
| 4,687,727 A | 8/1987 | Toyama et al. | 430/175 |
| 4,845,008 A | 7/1989 | Nishioka et al. | 430/165 |
| 4,877,711 A | 10/1989 | Aoai et al. | 430/176 |
| 5,102,756 A | 4/1992 | Vincett et al. | 430/41 |
| 5,112,743 A | 5/1992 | Kamiya et al. | 430/175 |
| 5,143,816 A | 9/1992 | Mizutani et al. | 430/192 |
| 5,278,023 A | 1/1994 | Bills et al. | 430/201 |
| 5,353,705 A | 10/1994 | Lewis et al. | 101/453 |
| 5,368,974 A | 11/1994 | Walls et al. | 430/156 |
| 5,437,952 A | 8/1995 | Hirai et al. | 430/83 |
| 5,440,987 A | 8/1995 | Williams et al. | 101/454 |
| 5,491,046 A | 2/1996 | DeBoer et al. | 430/302 |
| 5,506,085 A | 4/1996 | Van Damme et al. | 430/200 |
| 5,552,260 A | 9/1996 | Vogel et al. | 430/270.1 |
| 5,695,905 A | 12/1997 | Savariar-Hauck et al. | 430/162 |
| 5,700,619 A | 12/1997 | Baumann et al. | 430/175 |
| 5,759,742 A | 6/1998 | West et al. | 430/278.1 |
| 5,846,685 A | 12/1998 | Pappas et al. | 430/156 |
| 5,858,604 A | 1/1999 | Takeda et al. | 430/162 |
| 5,858,626 A | 1/1999 | Sheriff et al. | 430/326 |
| 5,922,502 A | 7/1999 | Damme et al. | 430/162 |
| 6,037,102 A * | 3/2000 | Loerzer et al. | 430/306 |
| 6,245,481 B1 | 6/2001 | Teng | 430/270.1 |
| 6,245,486 B1 | 6/2001 | Teng | 430/303 |

FOREIGN PATENT DOCUMENTS

| | | |
|---|---|---|
| DE | 19644515 | 4/1998 |
| EP | 208145 | 1/1987 |
| EP | 507008 | 10/1992 |
| EP | 803770 | 10/1997 |
| EP | 909657 | 4/1999 |
| GB | 1546633 | 5/1979 |

* cited by examiner

*Primary Examiner*—Rosemary Ashton
(74) *Attorney, Agent, or Firm*—Baker Botts L.L.P.

(57) ABSTRACT

An imageable element comprises: (A) a substrate; and (B) an imageable composition applied to the substrate comprising: (1) a first layer, comprising: (a) a photosensitive composition capable of absorbing actinic radiation; and (b) a photothermal converter; and (2) an ablatable second layer contiguous to the first layer, wherein the second layer is opaque to the actinic radiation.

This imageable element advantageously is useful in both positive and negative working printing plate applications, increases the efficiency of use of mask-generating radiation such as IR radiation and eliminates the need for chemicals and additional time to create a mask.

36 Claims, No Drawings

IMAGEABLE ELEMENT AND METHOD OF PREPARATION THEREOF

BACKGROUND OF THE INVENTION

1. Field of the Invention

This invention relates to an imageable element comprising a substrate and an imageable composition supported on the substrate. More particularly, the imageable composition has a first layer applied to the substrate which comprises a photosensitive composition and a photothermal converter, and an ablatable second layer contiguous to the first layer wherein the second layer is opaque to actinic radiation. This invention also relates to a printing plate prepared from such an imageable composition, a method of making such printing plates, and a method of printing using such a plate to form a desired image on a medium.

2. Background Information

The offset lithographic printing process generally utilizes a chemically developed planographic printing plate having oleophilic image areas and hydrophilic non-image areas. When a roller carrying an oil-based ink composition is passed over a dampened plate, it will be unable to ink the hydrophilic non-image areas covered by aqueous film, but will emulsify the water droplets on the water repellant oleophilic image areas, which will then take up ink. The resulting ink image is transferred ("offset"), typically onto a rubber blanket, which is then used to print onto a medium such as paper.

In one type of technology used to produce printing plates the oleophilic image areas are formed from a photosensitive layer on a substrate. In negative working compositions, the photosensitive layer is first imagewise exposed to light that cures, hardens, or decreases the rate of dissolution in developer solution of the exposed areas. Subsequently, during the developing step, only the non-exposed areas are removed from the substrate by the developer solution. In positive-working compositions, the photosensitive layer is first imagewise exposed to light that renders the exposed areas more rapidly dissolvable in a given developer than the non-exposed areas, a process called photosolubilization. Subsequently, in the developing step, only the exposed areas are removed from the substrate.

A large number of positive-working photosensitive compositions exist as derivatives of naphthoquinone diazide sulphonates of phenol- or cresol-formaldehyde condensate resins. Likewise, there are a large number of negative-working photosensitive compositions prepared as N-aryl or N-alkyl phenylaminobenzene diazonium salt condensates with formaldehyde.

A technology widely used to prepare printing plates is POLYCHROME CTX (available from Kodak Polychrome Graphics), which is a two-layer composition in which the outer surface layer is a silver halide photosensitive system that can be exposed by visible light and chemically developed to provide a surface image mask for the layer beneath, which is also photosensitive. The developed outer layer is used to mask actinic light for which the layer below is photosensitive. After exposure to such actinic radiation, removal of the mask layer and portions of the underlayer by developer solution produces a printing plate capable of offset printing in which the substrate and remaining material from the lower layer have different affinities for ink or fountain solution. Two developing steps are needed in this system; i.e. one for the mask, and one for the photosensitive layer. Thus, this system requires additional time and the use of chemicals for processing the mask layer.

U.S. Pat. No. 5,102,756 describes a two-layer composition on a substrate in which the outer mask is created by imagewise exposure to visible light that causes softening of the layer and movement of migration marking particles in the outer layer so that a mask is formed for a photosensitive layer beneath. The migration marking particles can be made from selenium and its alloys.

Advances in digital computers and thermal imaging diodes have made possible new methods to image a substrate. For example, another method of making printing plates creates an image on a substrate by thermal ablation of a layer beneath the outer layer. In these methods, an additional layer that strongly absorbs the ablating light, usually infrared (IR) light, is placed between the outer layer and the substrate. The middle layer efficiently absorbs the ablating light and is imagewise ablated, leaving the outer layer imagewise unsupported. The unsupported outer layer is then easily removed to produce the image on the substrate. For example, U.S. Pat. No. 5,440,987 claims a lithographic member in which a layer characterized by ablative absorption of imaging radiation is coated by a layer having a different affinity for ink than the substrate, or having a different affinity for ink than a third layer beneath the ablative layer.

U.S. Pat. No. 5,353,705 describes a multilayer system for lithographic printing members in which a nitrocellulose infrared-absorbing layer is ablated beneath a silicone or polyester outer layer. Additional layers may be added to the system to enhance adhesion of the photosensitive layer to the substrate, and to prevent charring of the substrate or photosensitive layer.

Ablation may also be used to form the mask in the outer layer by direct absorption of light by the outer layer. For example, U.S. Pat. No. 5,922,502 and European Patent Publication 803,770 describe multilayer systems in which an outer layer comprising carbon black or IR dye in a binder polymer is ablated with IR laser light, creating a mask in the outer layer. The exposure to IR laser light was at a scan rate of 1.1 meters per second (spot size 15 micrometers, 1050 nm wavelength).

U.S. Pat. No. 5,858,604 describes a lithographic plate made from a two-layer composition by direct ablation of an outer mask layer that is above a photosensitive layer. Alternatively, the plate is prepared by ablation of an outer mask layer by a heat-generating layer between the outer layer and the photosensitive layer that is not necessarily also ablated. The IR laser light exposure power density in the focal surface used for ablation was preferably over 200,000 $W/cm^2$ (not less than 500 nm wavelength).

The dose of imaging light that is needed to create the mask in these methods is critical because it limits the rate at which the printing plate can be prepared by scanning a laser light beam across the plate. Therefore, a need exists for an imageable composition that can be used to make a printing plate by exposure to a reduced dose of radiation to create a mask for an underlying photosensitive layer. Such a mask could be efficiently and rapidly created for printing plate preparation with a computer-generated and driven radiation source, such as IR radiation. Such a composition would also eliminate the additional time and use of chemicals required in conventional applications such as POLYCHROME CTX silver halide mask technology.

It is one object of this invention to provide an imageable element which increases the efficiency of use of mask-generating radiation and eliminates the need for chemicals and additional time to create the mask. The imageable element of this invention advantageously provides rapid preparation of printing plates with a reduced dose of mask-generating radiation. It is another object of this invention to provide a method of making such an imageable element. Other objects, features and advantages of this invention will be apparent to those skilled in the art from this specification and the appended claims.

SUMMARY OF THE INVENTION

The limitations of current technology described above are overcome by the imageable element of this invention, which comprises a substrate having applied thereon a first layer and a second layer contiguous to the first layer. The first layer comprises a photosensitive material and a photothermal converter. The second layer is ablatable and opaque to actinic radiation used to affect the solubility of the first layer. The imageable element is first imagewise exposed to ablative electromagnetic radiation (i.e. radiation having a wavelength different than the actinic radiation which affects the solubility of the first layer). The photothermal converter in the first layer imagewise absorbs the ablative electromagnetic radiation (e.g. IR radiation), and thereby causes selective imagewise ablation of the second layer. Although the second layer is ablatable, the second layer itself does not absorb the ablative electromagnetic radiation sufficiently to cause ablation of the second layer. Instead, ablation of the second layer is caused by absorption of electromagnetic radiation (e.g. IR radiation) by the underlying first layer which causes selective removal of the second layer. The remaining (i.e. non-ablated portions) of the second layer provide a mask for the first layer. The imageable element is thereafter overall exposed to actinic radiation (e.g. UV or visible radiation) which increases or decreases the solubility of the first layer in a developer solution, corresponding to a positive- or negative-working process, respectively.

In another embodiment, this invention is an imageable element comprising the imageable composition and a hydrophilic substrate such as an aluminum substrate. The substrate has an affinity for printing solution that is opposite to the photosensitive layer, and the imageable element is suitable for offset printing.

In another embodiment, this invention is a method of forming an image onto a substrate by exposing and developing the imageable element of this invention.

For a better understanding of the present invention and its objects, reference is made to the following description to be considered in light of the complete application, and the scope of this invention as pointed out in the appended claims.

DETAILED DESCRIPTION OF THE INVENTION

The imageable element of this invention comprises an imageable composition comprising a first layer and a second layer. The first layer, which is applied to a surface of the substrate, comprises a photosensitive composition that absorbs actinic radiation (e.g. radiation in the ultraviolet (UV) or visible spectral range, or both), which renders the first layer either more or less soluble in a developer liquid, corresponding to a positive- or negative-working process, respectively. As used in this specification and the appended claims "actinic radiation" refers to radiation that induces photochemical reaction of the photosensitive material of the first layer, not radiation which induces heat generation in the first layer and ablation of the second layer, as discussed further herein. As used herein, "ablative radiation" refers to electromagnetic radiation which is absorbed by the photothermal converter in the first layer thereby causing imagewise ablation of the second layer.

Printing plates are negative-working if the imagewise exposed areas become the image areas, i.e. the ink-receptive areas; otherwise they are positive-working. As will be apparent to those skilled in the art, this definition applies to all plates, including CTX-type (as described herein), ablation type, and waterless plates. For printing plates made from a photosensitive layer in which the imagewise exposed areas become ink-receptive in the printing plate, it follows from the above definition that negative-working (also referred to as negative tone), corresponds to the actinic radiation exposed areas of the photosensitive layer being insolubilized, and positive-working corresponds to the actinic radiation exposed areas of the photosensitive layer being solubilized.

If there is more than one exposure, i.e. if there is a mask-forming outer layer, the terms positive-working and negative-working can apply to each exposure, or to the overall tone. For example, in CTX-type plates, the top outer layer, including silver emulsions, may be negative- or positive-working and the underlying photosensitive layer may also be positive- or negative-working. If both layers are either positive- or negative-working, then the overall tone is positive. If one layer is positive- and the other layer negative-working, then the overall tone is negative. When ablation is performed to create the mask in the second layer, as in the invention described here, the overall tone corresponds to the tone, positive or negative, of the underlying layer.

In positive-working embodiments of this invention, photosolubilizable compositions useful for the photosensitive composition in the first layer may be the reaction product of a naphthoquinone diazide reactive derivative with any type of monomer or resin that has a suitable reactive condensable group, for example a condensable hydroxy group. As used herein "resin" refers to a polymeric material. Naphthoquinone diazide reactive derivatives are known in the art and may be used in this invention, as described for example in U.S. Pat. No. 5,858,626, which is hereby incorporated by reference in its entirety. Illustrative examples of types of monomers and resins with suitable reactive condensable groups include phenolic resins, copolymers of hydroxystyrenes, acrylic resins containing pendent phenol groups, and mixtures thereof.

As used herein, "phenolic resins" refers to light-stable, water-insoluble, alkali-soluble, film-forming resins that have a multiplicity of phenolic hydroxy groups either on the backbone of the resin or on pendant groups. The resins typically have a molecular weight of at least 350, and preferably of at least 1000, as determined by gel permeation chromatography. An upper limit of the molecular weight would be readily apparent to one skilled in the art, but practically it is about 100,000. The resins also have a pKa from or about 7 to or about 11, and are soluble in aqueous-alkaline media having a pH of about or greater than 7. Examples of such resins include novolac resins, resole resins, and pyrogallol condensates with ketones.

Novolac resins suitable for positive-working embodiments of this invention are polymers produced by condensation of a phenol and an aldehyde, such as formaldehyde, or an aldehyde-releasing compound capable of undergoing phenol-aldehyde condensation, in the presence of an acid catalyst. Typical novolac resins include phenol formaldehyde resins, m-cresol formaldehyde resins, p-cresol formaldehyde resins, mixed m/p-cresol formaldehyde resins, and mixed phenol/cresol formaldehyde resins. Such compounds are well known and are described, for example, in U.S. Pat. Nos. 4,308,368, 4,845,008, 5,437,952, 5,491,046, 5,143,816, and GB 1,546,633, all of which are incorporated herein by reference.

Another type of phenolic resin suitable for this invention is a condensation product of pyrogallol and a ketone, preferably acetone. Illustrative examples of resins of this type and their reaction products with diazo compounds are described in U.S. Pat. No. 3,635,709, which is incorporated herein by reference. Yet another useful phenolic resin is a "resole resin" that is a condensation product of a phenol and formaldehyde, in the presence of a base catalyst.

Another type of resin suitable for condensation with diazide reactive derivatives is a polyvinyl compound having phenolic hydroxyl groups. Such compounds include polyhydroxystyrenes, as described for example in U.S. Pat. No. 4,845,008. Other hydroxy-containing polyvinyl compounds are described in U.S. Pat. Nos. 4,306,010 and 4,306,011 (both of which are incorporated herein by reference), which are prepared by reacting a polyhydric alcohol and an aldehyde or ketone. Further polyvinyl compounds suitable for this invention are acrylic resins having pendent phenol groups.

Naphthoquinone diazide reactive derivatives useful as the photosensitive composition in the first layer of positive-working embodiments of this invention include 1,2-naphthoquinone diazide sulfonate esters. Thus, polymeric compounds particularly preferred for the photosensitive composition in the first layer are photosolubilizing 1,2-naphthoquinone diazide sulphonates of pyrogallol-acetone copolymers.

Additional resins useful in positive-working embodiments of this invention include copolymers of acrylates and methacrylates with hydroxy-containing acrylates or methacrylates, as described in U.S. Pat. No. 3,859,099, which is incorporated herein by reference. Such copolymers include, for example, copolymers of hydroxyethyl methacrylate and methyl methacrylate. Further examples include copolymers of polyhydroxy styrenes with esters of ethylenically unsaturated acids such as meth acrylic methyl esters or acrylic acid ethyl esters.

A mixture of the resins described above can be used, but in a particularly preferred embodiment, a single novolac resin is present in the first layer of the radiation sensitive imageable composition of this invention.

In negative-working embodiments of this invention, photoinsolubilizable compositions useful for the photosensitive composition in the first layer may be diazonium polycondensation products such as the reaction product of a reactive diazonium salt derivative with any type of monomer or resin that has a suitable reactive condensable group. For example, such monomers or resins can have reactive condensable aldehyde groups. Preferably, formaldehyde and bis-methoxymethyl diphenyether are used as the condensable reactant. Illustrative examples of such diazonium compounds and derivatives which may be used in this invention are described in U.S. Pat. No. 4,631,245, which is incorporated herein by reference. A particularly preferred compound is the polymeric condensate of 4-phenylamino-2-methoxyphenyl diazonium salt with 4,4'-bismethoxymethyl diphenylether, and isomers thereof.

Reactive diazonium salt derivatives useful for the photosensitive composition in the first layer of this invention include derivatives of N-aryl and N-alkyl aminoaryl diazonium salts. Further illustrative examples of polymeric compounds for the photosensitive composition in the first layer are photohardening condensates of p-phenylaminobenzene diazonium and formaldehyde.

In preferred embodiments, the photosensitive composition in the first layer may comprise a diazonium salt of the following formula:

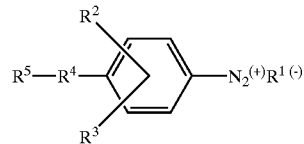

wherein $R^1$ is an anion, $R^2$ and $R^3$ represent optional substitution, $R^4$ is $-NR^6-$ or $-S-$, and $R^5$ is a group which after exposure of the radiation sensitive imageable composition renders the residue of the diazonium salt oleophilic and fount insoluble. When $R^4$ is $-NR^6-$, $R^6$ may be H, alkyl, aryl or aralkyl, and is preferably H.

Preferably, $R^1$ is a sulphonate. When present, $R^2$ and $R^3$ are preferably selected from alkoxy, halogen, alkyl, or amine. The presence of a substituent group $R^2$ or $R^3$ helps to stabilize the diazonium compound. Preferably, $R^5$ is a group of the formula:

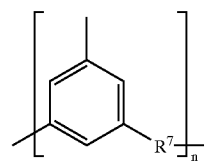

where $R^7$ is the residue of a condensing agent, and n is 1 to 100. For example, $R^7$ may be $-CH_2-$ or:

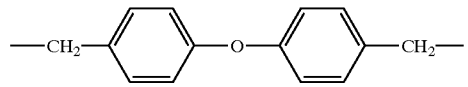

Thus, the group $R^5$ comprises a condensable group to convert the diazonium compound to a diazonium resin to prevent the exposed diazonium salt from washing off during processing.

The photosensitive composition of the first layer is preferably a polymeric condensate of a diazonium salt or mixture of diazonium salts with formaldehyde, 4,4'-bismethoxymethyl diphenylether and mixtures and derivatives thereof, such as described in U.S. Pat. No. 4,631,245. Further illustrative examples of diazonium salts useful in the present invention are as follows:

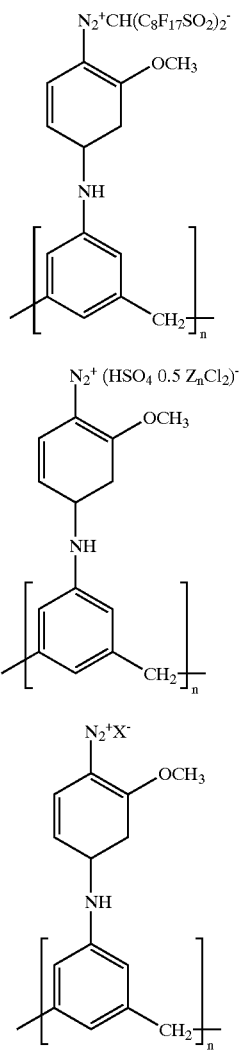

diazonium A diazonium B diazonium C where n is 1 to 11, and X⁻ is a counteranion such as $SO_3R^-$, $BF_4^-$, $PF_6^-$, and the like, where R is an alkyl, aryl or aralkyl residue.

Illustrative examples of commercially available materials suitable for the photosensitive first layer of this invention are described in U.S. Pat. No. 4,687,727, which is incorporated herein by reference. An example compound is a condensate of 3-methoxydiphenylamine-4-diazonium sulfate and 4,4'-bismethoxymethyl diphenylether, preferably precipitated as the mesitylene sulfonate, available as NEGA 107 (Panchim).

The diazonium polycondensation products used in this invention may be obtained by a condensation reaction of diazo monomers with aldehydes and precipitation of the reaction product with a certain anion prepared by condensing a diazo monomer such as 4-diazo-diphenylamine, 1-diazo-4-N,N-dimethylaminobenzene, 1-diazo-4-N,N-diethylaminobenzene, 1-diazo-4-N-ethyl-N-hydroxyethylaminobenzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazodimethylaniline, 1-diazo-2,5,-dibutoxy-4-morpholinobenzene, 1-diazo-2,5-diethoxy-4-morpholinobenzene, 1-diazo-2,5-dimethoxy-4-p-tolymercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidinobenzene, 3-methoxy-4-diazodiphenylamine, 3-ethoxy-4-diazodiphenylamine, 3-(n-propoxy)-4-diazodiphenylamine or 3-(isopropoxy)-4-diazodiphenylamine with a condensing agent such as formaldehyde, acetaldehyde, propionaldehyde, butyric aldehyde, isobutyic aldehyde, benzaldehyde or aldehydes containing one or more carboxylic groups as described in U.S. Pat. No. 5,112,743 (incorporated herein by reference), preferably in a molar ratio of 1:1 to 1:0.5, more preferably 1:1 to 1:08, by a conventional process, followed by precipitation with a suitable anion.

Diazonium polycondensation products soluble in organic solvents are for instance obtained by selecting tetrafluoroboric acid, hexafluorophosphoric acid, hexafluoroantmonic acid, hexafluoroarsenic acid, triisopropylnapthalenesulfonic acid, 4,4'-biphenyldisulfonic acid, 5-nitro-o-toluenesulfonic acid, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-chloro-5-nitrobenzenesulfonic acid, 2-fluorocaprylnaphthalenesulfonic acid, 1-naphthol-5-sulfonic acid, 2-methoxy-4-hydroxy-5-benzoyl-benzene-sulfonic acid, 4-toluenesulfonic acid, and the like as anion source. Among these, 2,4,6-trimethylbenzene sulfonic acid and 2-methoxy-4-hydroxy-5-benzoylbenzene-sulfonic acid are particularly preferred.

Furthermore, mixed condensation products may be used which, apart from the diazonium salt units, comprise other non-photosensitive units, which are derived from condensable compounds, in particular from aromatic amines, phenols, phenol ethers, aromatic thioethers, aromatic hydrocarbons, aromatic heterocycles or organic acid amides.

Other illustrative examples of diazonium polycondensation products are adducts of diazonium resins with sulfonated polymers. Such diazonium adducts can be used without a binder, in place of the diazonium salt condensates which may be used with a binder. Diazonium adducts consisting of diazonium resins with sulfonated acrylic polymers are described in U.S. Pat. No. 5,846,685; corresponding adducts consisting of diazonium resins with sulfonated polyesters are disclosed in U.S. Pat. Nos. 4,408,532 and 5,846,685, both of which are incorporated herein by reference.

Further illustrative examples of diazonium polycondensation products useful for the photosensitive composition in the first layer may contain aryldiazosulfonate groups, as described in European Patent Publication 0 507 008, which is incorporated herein by reference.

The diazonium polycondensation product or products are preferably present in the radiation sensitive imageable compositions in an amount from about 1 to about 98 wt. %, more preferably from about 5 to 80 wt. % and most preferably from about 20 to about 60 wt. %, based on the composition of the solution used to apply the first layer.

In both positive- and negative-working embodiments of this invention, the first layer may additionally comprise polymeric compounds that act as binders and promote adhesion to the substrate, or other purposes known to those of skill in the art. Illustrative examples of binder polymeric compounds suitable for positive-working embodiments include the phenolic resins described above. A particularly preferred binder polymeric compound for a positive-working embodiment is a novolac resin.

Polymeric compounds useful as binders should be chosen to reduce intermixing of the first and second layers. Illustrative examples of binder polymeric compounds suitable for negative-working embodiments include copolymers of vinyl acetate such as vinyl acetate/crotonate/vinyl neodecanoate copolymers, copolymers of styrene and maleic anhydride, carboxyl-functionalized polyvinyl acetals, acetal-functionalized polyvinyl alcohols as described in U.S. Pat. No. 5,700,619 (incorporated herein by reference), and acrylics.

For negative-working embodiments, the polymeric binder may be any binder known to be useful in conventional printing plates based on diazonium polycondensation products. Such binders are usually alkali-soluble resins. From the standpoint of developability acryl type resins are preferred, while from the standpoint of durability polyurethane resins and an acetal-modified poly(vinyl alcohol) resin are preferred. Further suitable binder materials are for instance disclosed in U.S. Pat. Nos. 3,847,614, 4,154,614, DE 19 64 4515, U.S. Pat. Nos. 5,695,905, 4,877,711, and EP 208145, which are all hereby incorporated by reference in their entireties. Especially preferred are polyvinylacetal binders comprising the following units A, B and C:

(A)
—CH$_2$—CH—
　　　|
　　　OH (B)
—CH$_2$—CH—
　　　|
　　　O—COR$^1$ (C)
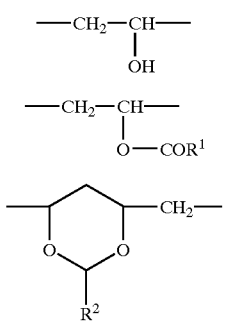

wherein R$^1$ is H or C$_1$–C$_4$ alkyl, CH=CHCOOH or

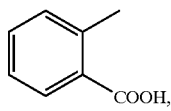

R$^2$ is H, C$_1$–C$_4$ alkyl, aryl,

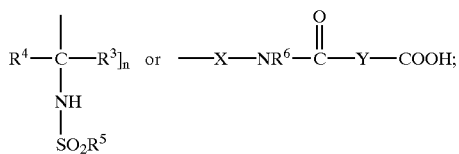

wherein R$^3$ and R$^4$ are independently selected from hydrogen and methyl, n is an integer from 1 to 3 and R$^5$ is alkyl, aralkyl, aryl, alkoxyaryl or alkanoyl amide aryl wherein the alkyl moieties have 1 to 8 carbon atoms and the aryl moieties have 6 or 10 carbon atoms, R$^6$ is hydrogen or an aliphatic, aromatic or aralipathic group having 1 to 10 carbon atoms, Y is —CR$^7$R$^8$—CR$^9$R$^{10}$—, —CR$^7$=CR$^8$—, or of the following structures:

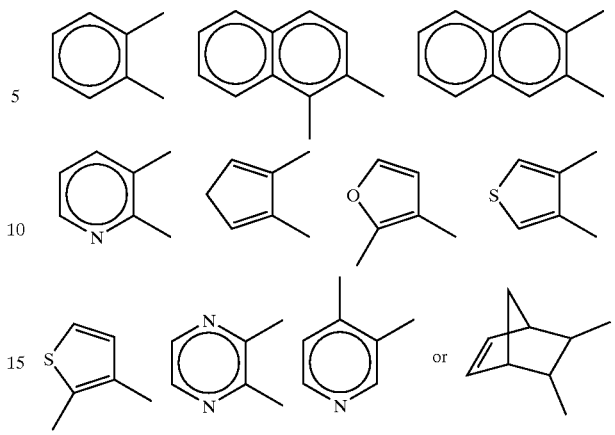

wherein R$^7$, R$^8$, R$^9$, R$^{10}$ each are independently hydrogen or C$_1$–C$_4$ alkyl, and X is —CH$_2$, —CH(CH$_3$) or —CH$_2$CH$_2$CH$_2$. Units (B) and (C) may be present more than once in a polymer molecule with independently selected different groups R$^1$ and R$^2$.

If a binder is present, the weight ratio of binder to the photosensitive composition of the first layer is preferably from about 50:1 to about 0.1:1, more preferably from about 20:1 to about 0.2:1, and most preferably from about 5:1 to about 0.3:1, based on the composition of the solution used to apply the first layer.

The first layer of the imageable composition of this invention also comprises a photothermal converter (PTC) material which is capable of absorbing electromagnetic radiation (e.g. IR radiation). In a preferred embodiment, the PTC material absorbs the electromagnetic radiation and generates heat sufficient to ablate the second layer. The PTC absorbs electromagnetic radiation at a different wavelength than the actinic radiation used to affect the solubility of the first layer. The PTC preferably absorbs visible to infrared radiation, and converts the radiation into thermal energy. Thus, heat sufficient to selectively ablate or remove the second layer is generated in the first layer.

It has been discovered that such ablation of the second layer by absorption of electromagnetic radiation in the first layer sufficient to cause such ablation, without absorption of electromagnetic radiation in the second layer itself sufficient to cause such ablation, thereby unexpectedly requiring a relatively low dose of radiation to generate the mask for the photosensitive layer, corresponding to efficient utilization of the exposure energy. Preferably the electromagnetic radiation employed to achieve such selective ablation is IR radiation. Using the radiation efficiently thereby minimizes the energy exposure necessary for generation of the mask in such two-layer systems and increases the rate at which the plate-setter may scan the radiation (e.g. the IR laser beam) to image and prepare the printing plate. Thus, the printing plate of this invention may advantageously be prepared at increased scan rates, or with lower exposure dose at a fixed scan rate.

A further advantage of this invention is that the printing plate may be prepared without the need of a second chemical development step as for silver halide mask technology.

The PTC of this invention is an electromagnetic radiation-absorbing compound which converts the absorbed radiation into heat. The PTC should not significantly interfere with the exposure of the photosensitive material in the first layer to actinic radiation (e.g. UV or visible radiation), and so the PTC should not substantially absorb the actinic radiation used to affect the solubility of the first layer, either before or after imagewise exposure of the element. Preferably, the PTC is a pigment or dye which absorbs in the IR or near IR range. Many such products are known to those skilled in the art. Preferably, the PTC comprises a dye or pigment selected from the group consisting of arylamminium, polymethine, quinolium, triarylamine, thiazolium, indolium, oxazolium, polyaniline, polypyrrole, polythiophene, thiolene metal complexes, squarilium, croconate, cyanine, phthalocyanine, merocyanine, chalcogenopyryloarylidine, bis(chalcogenopyrylo)polymethine, oxyindolizine, quinoid, indolizine, pyrylium, thiazine, azulenium, xanthene, carbon black, dark inorganic pigments, black pigments, yellow pigments, orange pigments, brown pigments, red pigments, violet pigments, blue pigments, green pigments, fluorescent pigments, azo pigments bound to a polymer, anthraquinone pigments bound to a polymer, quinacridone pigments bound to a polymer, and mixtures thereof. Further illustrative examples of infrared-absorbing compounds useful as a PTC are given in U.S. Pat. Nos. 5,858,626 and 5,759,742, incorporated herein by reference. Other examples include, but are not limited to Cyasorb IR 99 (Glendale Protective Technology), Epolite IV-62B (Epoline Corp.), PINA-780 (Allied Signal Corp.), Spectra IR-830A (Spectra Colors Corp.), and Project 900 (Zeneca Corp.). A particularly preferred PTC is ADS-830A (ADS Corp.) infrared dye.

The PTC pigments or dyes may be present in the first layer of the radiation sensitive imageable composition of this invention preferably in an amount from or about 0.1 to or about 30 weight percent, more preferably from or about 1 to or about 20 weight percent, and most preferably from or about 3 to or about 15 weight percent, based on the composition of the solution used to apply the first layer.

The second layer of the radiation sensitive imageable composition of this invention is ablatable, most preferably thermally ablatable. As used herein "thermally ablatable" refers to and is meant to convey that imagewise absorption by the first layer of electromagnetic radiation at a wavelength different than the actinic radiation used to affect the solubility of the first layer and generation of heat by the first layer due to such imagewise absorption causes selective removal of the second layer. The second layer is opaque to and absorbs the actinic radiation which affects the solubility of the first layer, thereby enabling the second layer to serve as an in situ mask for the first layer. Accordingly, the second layer should have a high extinction coefficient for the actinic radiation used to affect the solubility of the first layer.

The second layer itself does not itself absorb electromagnetic radiation sufficiently to cause selective ablation of the second layer. Instead, the second layer is selectively removed by ablation upon a first imagewise exposure of the imageable composition to electromagnetic radiation because of heat generated by the PTC located in the first layer. Accordingly, in a preferred embodiment of this invention, the second layer does not contain a PTC. In another preferred embodiment, the second layer is transparent to the thermally ablative radiation. Without intending to be bound by any one theory, it is believed that the second layer may ablate efficiently because of thermally-induced loss of adhesion to the first layer. Further, the use of relatively low molecular weight and brittle polymeric material in the second layer, which may evolve nitrogen gas in the ablation process, may make ablation more efficient.

The thermally ablatable second layer comprises at least one polymeric material. In a preferred embodiment, the thermally ablatable second layer comprises a diazonium polycondensation product. Such products have been described above as being useful for the photosensitive composition in the first layer.

Further illustrative examples of compounds suitable for use as the polymeric material included in the second layer of this invention are polymeric compounds containing groups derived from an azo, triazene, tetrazene, pentazadiene, or hexazadiene moiety as described in U.S. Pat. No. 5,506,085 (incorporated herein by reference), gas-producing polymeric compounds containing azido groups ($-CH_2N_3$) derived from an oxirane, thiirane, or aziridine, or polymeric compounds derived from polyoxetanes containing azido groups, as described in U.S. Pat. No. 5,278,023 (incorporated herein by reference), and polymeric compounds containing aryldiazosulfonate groups or aryldiazonium salt groups, as described in European Patent Publication 507 008 (incorporated herein by reference).

The second layer of the radiation sensitive imageable composition of this invention optionally comprises a water soluble polymeric material such as polyvinylalcohol.

Optionally, a UV absorber may be added to the second layer to enhance the utility of the layer as a mask. For example, 2-hydroxybenzophenone or 2-hydroxyphenylbenzotriazoles, and the like, which can be used for UV stabilization, may be added to the second layer to enhance UV-masking.

Optional, non-essential layers may be combined with this invention. In particular, a protective or other type of layer over the second layer may be used. Further, a subbing or antihalation layer can be placed under the first layer, or on the backside of the substrate, such as when the substrate is a transparent polymeric film.

Exposure indicators may be used in the first layer of this invention as are known to those of skill in the art. Exposure indicators which may be used include those from the series of triarylmethane dyes such as Victoria blue BO, Victoria blue R, and crystal violet, or azo dyes such as 4-phenylazodiphenylamine, azobenzene, or 4-N,N-dimethylaminoazobenzene.

Suitable dyes for increasing the image contrast are those that are easy to dissolve in the solvent used for coating the layers onto the substrate, or which may be introduced as pigment in dispersed form. Examples of suitable contrast dyes are rhodamine dyes, methyl violet, anthraquinone pigments, and phthalocyanine dyes. Preferably, the dyes are present in the radiation sensitive imageable composition in an amount from or about 0.1 to or about 15 weight percent, more preferably from or about 0.2 to or about 7 weight percent, based on the composition of the solution used to apply the first layer.

In another embodiment, this invention is an imageable element comprising the imageable composition described herein applied to a hydrophilic substrate, such as a treated aluminum substrate as described herein. The substrate has an affinity for printing solution that is opposite to the photosensitive layer, and thus suitable for preparing a plate for offset printing.

In another preferred embodiment of this invention, the thermally ablatable second layer comprises a diazonium salt, the photosensitive composition of the first layer is a 1,2-naphthoquinone diazide condensate, and the imageable element is positive-working.

This invention is, in further embodiments, a method of preparing an imageable element from the imageable composition. The first layer, which is photosensitive, is coated onto the substrate, by coating methods well known to those skilled in the art, such as roll coating, gravure coating, spin-coating or whirling. Roll coating and gravure coating are particularly preferred. The second layer, which forms the mask, is then coated onto the first layer, followed by drying. The coating solvent used for the second layer preferably does not dissolve or penetrate the first layer. Methods known to those of skill in the art used for coating substrates with imageable compositions, such as those described in European Patent Application EP 909 657 (incorporated herein by reference), can be used.

For the preparation of printing plates, the imageable composition is applied, preferably by coating techniques, onto a suitable support such as a metal, polymeric film, ceramic, or polymeric-coated paper using conventional procedures and equipment. Suitable metals include aluminum, zinc or steel, but preferably, the metal is aluminum. A most preferred support is an electrochemically grained and sulfuric acid anodized aluminum sheet that has been further treated with an acrylamide-vinylphosphonic acid copolymer according to the teaching in U.S. Pat. No. 5,368,974 (incorporated herein by reference). Such elements are generally known as lithographic printing plates, but other useful elements include printed circuit boards. Typically, an aluminum substrate is first grained by brushing in dry condition, by brushing with an abrasive suspension, or by electrochemical brushing, for example in a hydrochloric acid electrolyte. The grained plates, which optionally have been subjected to an anodic oxidation in sulfuric or phosphoric acid, are then subjected to a hydrophilizing treatment, preferably in aqueous solutions of polyvinyl phosphonic acid or phosphoric acid. Such substrate pretreatments are well known to those of skill in the art.

The dried substrate is coated with the imageable composition such that the dry weight of the first layer of the imageable element is preferably from about 0.1 to about 5 $g/m^2$, more preferably from about 0.2 to about 4 $g/m^2$, most preferably from about 0.4 to about 2 $g/m^2$. The dried substrate is coated with the imageable composition such that the dry weight of the second layer of the imageable element is preferably from about 0.1 to about 2 $g/m^2$, more preferably from about 0.2 to about 1 $g/m^2$, most preferably from about 0.3 to about 0.6 $g/m^2$.

In another embodiment, this invention is a method of making a printing plate by exposing and developing the imageable composition of the imageable element. A first exposure is made imagewise with ablative electromagnetic radiation to ablate the imagewise exposed portions of the second layer. This first imagewise exposure is preferably made using IR radiation or visible light, most preferably IR radiation which is absorbed by the PTC in the first layer and converted to heat. This heating causes selective ablation of the second layer of the imageable composition and the non-ablated portion of the second layer forms a mask for the underlying first layer. The portions of the second layer which have been imagewise exposed are rendered easily removable by ablation due to heat generated by absorption of the electromagnetic radiation (e.g. IR or visible light) in the first layer. Any residual material of the second layer in the imagewise exposed portions may be removed, for example, by wiping with cotton pad, to reveal the underlying first layer. Following the first (i.e. imaging) exposure and the ablation and removal of the imagewise exposed portions of the second layer, the imageable element is overall (i.e. flood) exposed with actinic radiation (e.g. UV) and then developed to form the printing plate, using development methods well known to those skilled in the art.

The elements of this invention are uniquely adapted for "computer-to-plate" (CTP) imaging applications. Such systems utilize digitized image formation, as stored on a computer disk, compact disk, computer tape or other digital information storage media, or information that can be provided directly from a scanner, that is intended to be printed. The bits of information in a digitized record correspond to the image elements or pixels of the image to be printed. This pixel record is used to control the exposure device, that is a modulated laser beam. The position of the laser beam can be controlled using any suitable means known in the art, and turned on and off in correspondence with pixels to be printed. The exposing beam is focused onto the unexposed imageable element of this invention. Thus, no developed mask film is needed for this invention, as in the conventional lithographic imaging processes.

Laser imaging may be carried out using any moderate or high-intensity laser diode writing device. During operation, the element to be exposed may be placed in the retaining mechanism of the writing device and the write beam scanned across the element to generate an image. A laser printing apparatus may be used that includes a mechanism for scanning the write beam across the element. The imageable element of this invention is preferably imaged using ablative radiation at energy densities less than about 300 $mJ/cm^2$.

The imageable element, after the first (i.e. imaging) exposure, has open portions of the second layer in the regions which were imagewise exposed during the first exposure, and is overall (i.e. flood) exposed to actinic radiation, thereby affecting the solubility of the open (i.e. non-masked) portions of the first layer by a developer liquid, depending upon whether the first layer is positive- or negative-working, as follows: when the first layer is positive-working, the developer liquid selectively removes the open portions of the first layer, thereby revealing the hydrophilic substrate and retaining the portions unexposed during the first exposure as the ink-receiving image areas. The portions of the second layer not exposed during the first exposure are also removed in the development process. Development may be carried out under conventional conditions, from or about 30 to or about 120 seconds. One useful aqueous alkaline developer solution is a silicate solution containing an alkali metal silicate or metasilicate. Such a developer solution may be obtained from Eastman Kodak Company as KODAK PRODUCTION SERIES MACHINE DEVELOPER/POSITIVE.

Alternatively, when the first layer is negative-working, the open portions of the first layer are retained as the ink-receiving image areas and the developer liquid selectively removes the remaining portions, which were unexposed during the first exposure, thereby revealing the hydrophilic substrate.

Negative-working embodiments of this invention may be on-press developable when photoinsolubilizing or free radical polymerizable materials are used for the photosensitive composition of the first layer. In addition, positive-working embodiments of this invention may be on-press developable when the photosensitive composition of the first layer is based on acid generation and solubilization of polymers containing acid-labile insolubilizing groups, as described in U.S. Pat. Nos. 5,552,260 and 4,506,003, both of which are incorporated herein by reference. When the imageable element is on-press developable, the thermally exposed imageable element may be directly mounted on a printing press, subsequent to exposure, in which the fountain solution or ink, or a combination thereof, serves as the developer liquid.

The developed plates are usually treated with a preserving agent or finisher such as gum arabic, i.e. so-called "gumming." The preserving agents are aqueous solutions of hydrophilic polymers, wetting agents, and further additives. Optionally, a post-development baking step can be used, if desired, to increase run length of the plate.

The imageable element of this invention is preferably useable for the preparation of printing plates, including lithographic plates. In another embodiment, this invention includes a method to copy an image onto a medium by employing such a printing plate.

The following examples further describe and demonstrate embodiments within the scope of the present invention. The examples are given solely for the purpose of illustration and are not to be construed as limitations of the present invention. While there have been described illustrative embodiments of this invention, those skilled in the art will recognize that they may be changed or modified without departing from the spirit and scope of this invention, and it is intended to claim all such changes and modifications that fall within the true scope of the invention as set forth in the appended claims.

EXAMPLE 1

A first polymeric solution was prepared by dissolving 3.33 g of a cresol-formaldehyde novolac resin, SD-140A (Borden Chemicals), 1.66 g of a 1,2-naphthoquinone diazide-functionalized pyrogallol acetone copolymer, P-3000 (Kodak Polychrome Graphics, Inc.), and 0.9 g of ADS-830A IR dye (ADS, Inc.) into a solvent mixture containing about 40% methyl ethyl ketone and about 60% 2-methoxyethanol. The solution was spin-coated on an electrolytically grained and anodized aluminum substrate, hydrophilized with polyvinyl phosphonic acid, to provide a first layer having a dry weight of 1.7 g/m$^2$.

A second polymeric solution was prepared by dissolving 4.0 g of a polymer condensate of p-diazodiphenylamine bisulphate with formaldehyde, DTS-18 (P.C.A.S., France), and 1.0 g of a polyvinyl alcohol resin, Airvol 203-S (Air Products), into a solvent mixture containing 95% water and 5% methanol. The second solution was spin-coated onto the first layer on the substrate to provide a second layer having a dry weight of 0.6 g/m$^2$.

The two-layer, coated plate was imaged on a Creo Trendsetter (wavelength 830 nm) at an energy density between 140 and 200 mJ/cm$^2$. Ablation of the top layer and debonding of the top layer from the bottom layer were in evidence in the exposed areas. Remaining second layer material was removed by wiping with a cotton pad. The plate was then UV flood exposed at 350 mJ/cm$^2$ and developed, using standard positive plate developer 3000, available from Kodak Polychrome Graphics, to provide a printing plate having high resolution.

EXAMPLE 2

A two-layer coated plate was prepared as described in Example 1, except that a positive-working X-909 substrate plate, as described in Example 4 of U.S. Pat. No. 5,858,626 (incorporated herein by reference), was used. The two-layer, coated plate was imaged and processed, as described in Example 1, to provide a printing plate having high resolution.

EXAMPLE 3

A first polymeric solution was prepared by dissolving 2.5 g of a vinyl acetate/crotonate/vinyl neodecanoate copolymer, 28-2930 copolymer (National Starch and Chemical Co.), and 2.5 g of a styrene/maleic anhydride copolymer, Scripset-550 (Monsanto), in 70 ml of 2-methoxyethanol and 30 ml of methyl ethyl ketone. To this solution was added 5.0 g of N-5000 negative diazo (P.C.A.S., France) and 1.4 g of ADS-830A infrared dye. The resulting mixture was stirred until all ingredients dissolved and then spin-coated on an electrolytically grained and anodized aluminum substrate, hydrophilized with polyvinyl phosphonic acid, to provide a first layer having a dry weight of 2.0 g/m$^2$.

A second polymeric solution was prepared as described for the second polymeric solution in Example 1 and spin-coated onto the first layer to provide a second layer having a dry weight of 0.6 g/m$^2$.

The two-layer, coated plate was thermally imaged, wiped with a cotton pad and flood exposed, as described in Example 1, followed by development with a standard negative developer, PC-956 (available from Kodak Polychrome Graphics) to provide a printing plate having high resolution.

EXAMPLE 4

(Hypothetical)

A first polymeric solution is prepared by dissolving 3.33 g of a cresol-formaldehyde novolac resin, SD-140A (Borden Chemicals), 1.66g of a 1,2-naphthoquinone diazide-functionalized pyrogallol acetone copolymer, P-3000 (Kodak Polychrome Graphics, Inc.), and 0.9 g of ADS-830A IR dye (ADS, Inc.) into a solvent mixture containing about 40% methyl ethyl ketone and about 60% 2-methoxyethanol. The solution is spin-coated on an electrolytically grained and anodized aluminum substrate, hydrophilized with polyvinyl phosphonic acid, to provide a first layer.

A second polymeric solution is prepared by dissolving a suitable amount of a thermally degradable polymer composed of recurring units containing an azo group as disclosed in U.S. Pat. No. 5,506,085 in a suitable solvent, and spin coating the second solution onto the first layer to provide a thermally ablatable second layer. The amounts and solvents employed may be easily ascertained by those skilled in the art.

EXAMPLE 5

(Hypothetical)

A first polymeric solution is prepared by dissolving 3.33 g of a cresol-formaldehyde novolac resin, SD-140A (Borden Chemicals), 1.66 g of a 1,2-naphthoquinone diazide-functionalized pyrogallol acetone copolymer, P-3000 (Kodak Polychrome Graphics, Inc.), and 0.9 g of ADS-830A IR dye (ADS, Inc.) into a solvent mixture containing about 40% methyl ethyl ketone and about 60% 2-methoxyethanol. The solution is spin-coated on an electrolytically grained and anodized aluminum substrate, hydrophilized with polyvinyl phosphonic acid, to provide a first layer.

A second polymeric solution is prepared by dissolving a suitable amount of a gas-producing polymer having recurring units of an azido group, as disclosed in U.S. Pat. No. 5,278,023 in a suitable solvent, and spin coating the second solution onto the first layer to provide a thermally ablatable second layer. The amounts and solvents employed may be easily ascertained by those skilled in the art.

EXAMPLE 6

(Comparative)

An imageable element was prepared by applying a first layer comprising a diazonium polycondensation product to an aluminum substrate, and a second layer comprising a 1,2-napthoquinone diazide-functionalized pyro gallol acetone copolymer, P-3000 (Kodak Polychrome Graphics). The two-layer, coated plate was imaged on a Creo Trendsetter (wavelength 830 nm) at an energy density between 140 and 200 mJ/cm$^2$. The top layer did not ablate sufficiently for this imageable element to be used in accordance with the claimed invention.

As described in Example 6 above, it has been found that, when an naphthoquinone diazide condensate or derivative is used in the second layer of the imageable element, insufficient ablation of the second layer occurs at energy densities in the range of 140–200 mJ/cm$^2$. Accordingly, in one preferred embodiment of this invention, the second layer of the imageable element does not contain a naphthoquinone diazide condensate or derivative if ablation of the second layer using electromagnetic radiation at energy densities in the range of 140–200 mJ/cm$^2$ is desired.

Although this invention has been illustrated by reference to specific embodiments, it will be apparent to those skilled in the art that various changes and modifications may be made which clearly fall within the scope of this invention.

The invention claimed is:

1. An imageable element comprising:
   (A) a substrate; and
   (B) an imageable composition applied to the substrate comprising:
      (1) a first layer applied to the substrate, comprising (a) a photosensitive composition capable of absorbing actinic radiation, and (b) a photothermal converter; and
      (2) an ablatable second layer contiguous to the first layer, wherein the second layer is opaque to the actinic radiation and the second layer does not contain a photothermal converter.

2. The imageable element of claim 1, in which the photosensitive composition of the first layer comprises a photosolubilizable composition.

3. The imageable element of claim 2, in which the photosolubilizable composition comprises a condensate of a quinone diazide with a compound selected from the group consisting of phenolic resins, copolymers of hydroxystyrenes, acrylic resins containing phenol groups, pyrogallol-acetone copolymers, and mixtures thereof.

4. The imageable element of claim 2, in which the photosolubilizable composition comprises a photoinitiator which generates an acid and a polymer having acid-labile side chains.

5. The imageable element of claim 1, in which the first layer further comprises a polymeric binder.

6. The imageable element of claim 1, in which the second layer comprises a polymeric material having at least one nitrogen-containing moiety selected from the group consisting of aryldiazosulfonate, aryldiazonium salt, azo, azido, and mixtures thereof.

7. The imageable element of claim 1, in which the second layer comprises a condensate of an aryldiazonium salt with a compound selected from the group consisting of 4,4'-bis-methoxymethyl diphenylether, formaldehyde, and mixtures thereof.

8. The imageable element of claim 1, in which the second layer further comprises a polymeric binder.

9. The imageable element of claim 1, in which the photothermal converter is a dye or pigment selected from the group consisting of arylamminium, polymethine, quinolium, triarylamine, thiazolium, indolium, oxazolium, polyaniline, polypyrrole, polythiophene, thiolene metal complexes, squarilium, croconate, cyanine, phthalocyanine, merocyanine, chalcogenopyryloarylidine, bis (chalcogenopyrylo)polymethine, oxyindolizine, quinoid, indolizine, pyrylium, thiazine, azulenium, xanthene, carbon black, dark inorganic pigments, black pigments, yellow pigments, orange pigments, brown pigments, red pigments, violet pigments, blue pigments, green pigments, fluorescent pigments, azo pigments bound to a polymer, anthraquinone pigments bound to a polymer, quinacridone pigments bound to a polymer, and mixtures thereof.

10. The imageable element of claim 1, in which the photosensitive composition of the first layer comprises a photoinsolubilizable composition.

11. The imageable element of claim 10, in which the photoinsolubilizable composition comprises a condensate of an aryldiazonium salt with a compound selected from the group consisting of 4,4'-bis-methoxymethyl diphenylether, formaldehyde, and mixtures thereof.

12. The imageable element of claim 10, in which the photoinsolubilizable composition comprises an ethylenically unsaturated photopolymerizable compound or an ethylenically unsaturated compound capable of photocycloaddition.

13. The imageable element of claim 12, in which the photoinsolubilizable composition of the first layer further comprises a free radical photoinitiator or photosensitizer.

14. The imageable element of claim 1, wherein the substrate is an aluminum substrate having a hydrophilic surface underlying the first layer.

15. The imageable element of claim 1, in which the second layer does not contain a naphthoquinone diazide condensate or derivative.

16. An imageable element prepared by the process comprising:
   (A) providing a substrate;
   (B) admixing (i) a photosensitive composition which is capable of absorbing actinic radiation and (ii) a photothermal converter, and applying the admixture to the substrate to provide a first layer; and
   (C) applying an ablatable second layer which is opaque to the actinic radiation to the first layer, wherein the second layer does not contain a photothermal converter.

17. A method of forming an image comprising:
   (I) providing an imageable element comprising:
      (a) a substrate; and
      (b) an imageable composition applied on the substrate comprising (i) a first layer applied to the substrate, wherein the first layer comprises (A) a photosensitive composition capable of absorbing actinic radiation, and (B) a photothermal converter, and (ii) an ablatable second layer contiguous to the first layer, wherein the second layer is opaque to the actinic radiation and the second layer does not contain a photothermal converter;
   (II) exposing the imageable element imagewise to ablative radiation thereby causing ablation of the imagewise exposed portions of the second layer;
   (III) exposing the imageable element uniformly to actinic radiation; and
   (IV) developing the imageable element.

18. The method of claim 17, in which any partially ablated portions of the second layer are removed prior to exposure to the actinic radiation.

19. The method of claim 17, in which developing occurs by contacting the imageable element with a fountain solution, ink, or a combination thereof.

20. The method of claim 17, in which the ablative radiation is infrared radiation.

21. The method of claim 17, in which the second layer is thermally ablatable.

22. The method of claim 17, in which the ablative radiation used to cause ablation of the second layer has an energy density less than about 300 mJ/cm$^2$.

23. The method of claim 17, in which the second layer does not contain a napthoquinone diazide condensate or derivative.

24. The method of claim 17, in which the second layer is transparent to the ablative radiation.

25. A method of preparing an imageable element comprising:
(a) providing a substrate;
(b) applying a first layer to a surface of the substrate, the first layer comprising a photosensitive composition capable of absorbing actinic radiation and a photothermal converter; and
(c) providing an ablatable second layer contiguous to the first layer, wherein the second layer is opaque to the actinic radiation and the second layer does not contain a photothermal converter.

26. The method of claim 25, in which the photosensitive composition of the first layer comprises a photosolubilizable composition.

27. The method of claim 25, in which the thermally ablatable second layer comprises a polymeric material comprising at least one nitrogen-containing moiety selected from the group consisting of aryldiazosulfonate, aryldiazonium salt, azo, azido, and mixtures thereof.

28. The method of claim 25, in which the thermally ablatable second layer comprises a condensate of an aryldiazonium salt with a compound selected from the group consisting of 4,4'-bis-methoxymethyl diphenylether, formaldehyde, and mixtures thereof.

29. The method of claim 25, in which the photothermal converter is a dye or pigment selected from the group consisting of arylamminium, polymethine, quinolium, triarylamine, thiazolium, indolium, oxazolium, polyaniline, polypyrrole, polythiophene, thiolene metal complexes, squarilium, croconate, cyanine, phthalocyanine, merocyanine, chalcogenopyryloarylidine, bis(chalcogenopyrylo)polymethine, oxyindolizine, quinoid, indolizine, pyrylium, thiazine, azulenium, xanthene, carbon black, dark inorganic pigments, black pigments, yellow pigments, orange pigments, brown pigments, red pigments, violet pigments, blue pigments, green pigments, fluorescent pigments, azo pigments bound to a polymer, anthraquinone pigments bound to a polymer, quinacridone pigments bound to a polymer, and mixtures thereof.

30. The method of claim 25, in which the photosensitive composition of the first layer comprises a photoinsolubilizable composition.

31. The method of claim 25, in which the photoinsolubilizable composition comprises a condensate of an aryldiazonium salt with a compound selected from the group consisting of 4,4'-bis-methoxymethyl diphenylether, formaldehyde, and mixtures thereof.

32. The method of claim 31, which the photoinsolubilizable composition comprises an ethylenically unsaturated photopolymerizable compound or an ethylenically unsaturated compound capable of photocycloaddition.

33. The method of claim 31, in which the photoinsolubilizable composition of the first layer further comprises a free radical photoinitiator or photosensitizer.

34. The method of claim 31, wherein the substrate is an aluminum substrate having a hydrophilic surface upon which the first layer is applied.

35. An imageable element comprising:
(A) a substrate; and
(B) an imageable composition applied to the substrate comprising:
(1) a first layer applied to the substrate, comprising (a) a photosensitive composition capable of absorbing actinic radiation, and (b) a photothermal converter; and
(2) an ablatable second layer contiguous to the first layer, wherein the second layer is opaque to the actinic radiation and the second layer comprises a polymeric material having at least one nitrogen-containing moiety selected from the group consisting of aryldiazosulfonate, aryldiazonium salt, azo, azido, and mixtures thereof.

36. The imageable element of claim 35, wherein the second layer comprises a condensate of an aryldiazonium salt with a compound selected from the group consisting of 4,4'-bis-methoxymethyl diphenylether, formaldehyde, and mixtures thereof.

* * * * *